(12) United States Patent
Kressin (10) Patent No.: US 6,703,960 B2
(45) Date of Patent: Mar. 9, 2004

(54) ANALOG-TO-DIGITAL CONVERTER

(75) Inventor: Robert William Kressin, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/176,695

(22) Filed: Jun. 20, 2002

(65) Prior Publication Data

US 2003/0234735 A1 Dec. 25, 2003

(51) Int. Cl.[7] .............................................. H03M 1/36
(52) U.S. Cl. ...................... 341/159; 341/156; 341/160
(58) Field of Search ................................. 341/155, 156, 341/158, 159, 160

(56) References Cited

U.S. PATENT DOCUMENTS

| | | | | |
|---|---|---|---|---|
| 4,417,233 A | * | 11/1983 | Inoue et al. ................. | 341/159 |
| 4,602,241 A | * | 7/1986 | Dingwall .................... | 341/159 |
| 6,002,356 A | * | 12/1999 | Cooper ....................... | 341/160 |
| 6,373,423 B1 | * | 4/2002 | Knudsen ..................... | 341/159 |
| 6,480,134 B1 | * | 11/2002 | Sasaki ........................ | 341/159 |

* cited by examiner

Primary Examiner—Howard L. Williams (57) ABSTRACT

Disclosed herein is an analog-to-digital converter having first and second comparator stages, a voltage reference stage, a switching stage, and an encoder. The first comparator stage receives an analog signal and a threshold and outputs a control signal. The voltage reference stage receives the control signal and outputs one of two or more sets of reference voltages. The second comparator stage receives the analog signal, as well as the set of reference voltages output from the voltage reference stage, and outputs a thermometer code in response to comparisons of the analog signal to the reference voltages. The switching stage receives the control signal, and in response thereto, variously couples inputs of the encoder to: bits of the thermometer code output from the second comparator stage, a first potential, or a second potential. Methods for converting analog signals to digital signals are also disclosed.

20 Claims, 9 Drawing Sheets

ANALOG-TO-DIGITAL CONVERTER

FIELD OF THE INVENTION

The invention pertains to analog-to-digital converters.

BACKGROUND OF THE INVENTION

Analog-to-digital converters (ADCs) have existed for decades and are a key factor in the quality and speed of many test systems. One type of commonly used ADC is the flash ADC. A flash ADC is advantageous in many applications in that 1) it is easy to construct, 2) it has good matching, and 3) it has little intrinsic delay (i.e., it can perform fast A/D conversions).

Figure 9:
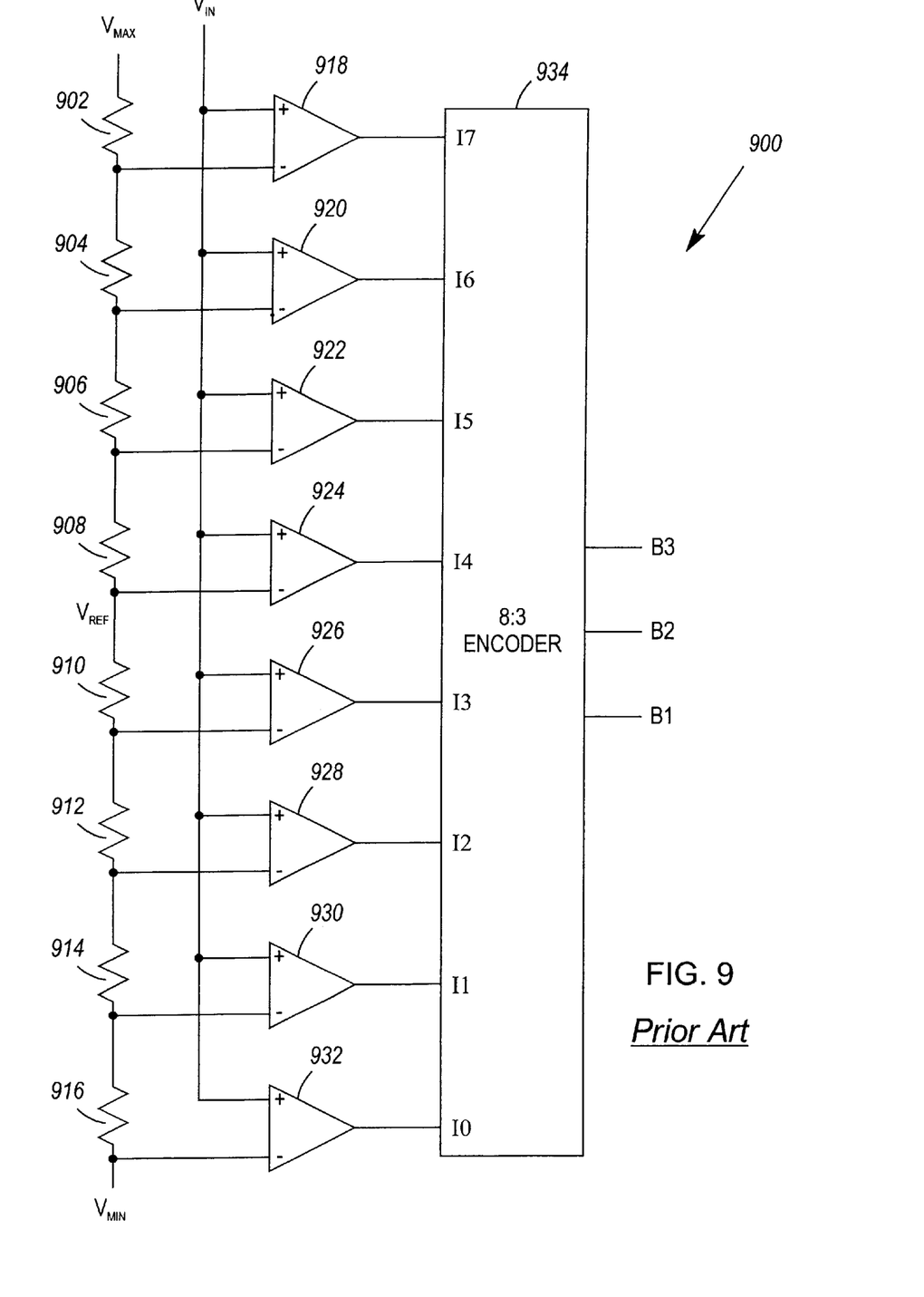
FIG. 9 illustrates a flash ADC.

An exemplary flash ADC is illustrated in FIG. 9. The ADC comprises a resistor network, a plurality of comparators, and an encoder. The resistor network serves to provide a different reference voltage to each of the comparators. Thus, when an analog voltage signal, $V_{IN}$, is received by each of the comparators, each comparator compares the analog voltage signal to a different reference voltage. If the analog voltage signal is greater than a comparator's reference voltage, the comparator drives its output high. If the analog signal is less than a comparator's reference voltage, the comparator drives its output low. In this manner, the comparators generate a thermometer code output (i.e., an output in which bits are consecutively asserted, beginning with a least significant bit). The thermometer code output generated by the comparators is then converted to a binary digital signal (B3, B2, B1) via the encoder.

Although the flash ADC is often relied on for its simplicity and speed, its advantages must sometimes be weighed against a number of disadvantages. One of its disadvantages is a high component count. Although the 3-bit ADC shown in FIG. 9 only requires eight resistors, eight comparators, and an encoder, an 8-bit ADC would require 256 resistors, 256 comparators, and an encoder. A flash ADC's resistor and comparator count therefore grows exponentially with respect to the number of bits in its output (i.e., an N-bit flash ADC requires $2^N$ resistors and $2^N$ comparators).

Another disadvantage of the flash ADC is its high aspect ratio. To maintain good matching, each of a flash ADC's $2^N$ resistor and comparator slices is typically stacked end-to-end. Since the number of stages in a flash ADC (i.e., resistor, comparator, and encoder) remains constant regardless of the value of N, a flash ADC with even a modest value of N will have a high aspect ratio. A high aspect ratio is problematic in that it makes a flash ADC difficult to integrate with other components on a die.

Related to the problem of high aspect ratio is the problem of input impedance mismatch. Input impedance mismatch results from the variance in signal route lengths needed to supply the analog voltage signal, $V_{IN}$, to each of a flash ADC's comparators. One can appreciate that this problem is exacerbated by higher values of N.

Other disadvantages of the flash ADC include a high input capacitance and excessive power dissipation. As the value of N is increased, the parasitic capacitance seen by the analog voltage signal, $V_{IN}$, grows exponentially. Likewise, the power consumed by a flash ADC grows exponentially.

SUMMARY OF THE INVENTION

In a first embodiment of the invention, an analog-to-digital converter comprises first and second comparator stages, a voltage reference stage, a switching stage, and an encoder. The first comparator stage receives an analog signal and a threshold and outputs a control signal. The voltage reference stage receives the control signal and outputs one of two or more sets of reference voltages. The second comparator stage receives the analog signal, as well as the set of reference voltages output from the voltage reference stage, and outputs a thermometer code in response to comparisons of the analog signal to the reference voltages. The switching stage receives the control signal, and in response thereto, variously couples inputs of the encoder to: bits of the thermometer code output from the second comparator stage, a first potential, or a second potential.

In a second embodiment of the invention, a method for converting analog signals to digital signals commences with the comparison of an analog signal, $V_{IN}$, to $(V_{MAX}-V_{MIN})/2$, where $V_{MAX}$ and $V_{MIN}$ define an expected voltage range for $V_{IN}$. In response to $V_{IN}$ being greater than $(V_{MAX}-V_{MIN})/2$, the LSB inputs of an encoder are driven to a first potential, and the MSB inputs of the encoder are determined by comparing $V_{IN}$ to a number of reference voltages ranging from $(V_{MAX}-V_{MIN})/2$ to $V_{MAX}$. In response to $V_{IN}$ being less than $(V_{MAX}-V_{MIN})/2$, the MSB inputs of the encoder are driven to a second potential, and the LSB inputs of the encoder are determined by comparing $V_{IN}$ to a number of reference voltages ranging from $V_{MIN}$ to $(V_{MAX}-V_{MIN})/2$. A digital signal is then output from the encoder.

In a third embodiment of the invention, a method for converting analog signals to digital signals commences as an analog signal is input to a comparator stage. At or about the same time, the analog signal is compared to at least one threshold. In response thereto, a voltage reference stage is programmed to deliver one of two or more sets of reference voltages to the comparator stage. Also, and in response to the comparison(s) of the analog signal to the threshold(s), different sets of an encoder's inputs are coupled to either: a first potential, a second potential, or outputs of the comparator stage. A digital signal is then output from the encoder.

BRIEF DESCRIPTION OF THE DRAWINGS

Illustrative and presently preferred embodiments of the invention are illustrated in the drawings, in which.

DESCRIPTION OF THE PREFERRED EMBODIMENT

Figure 1:
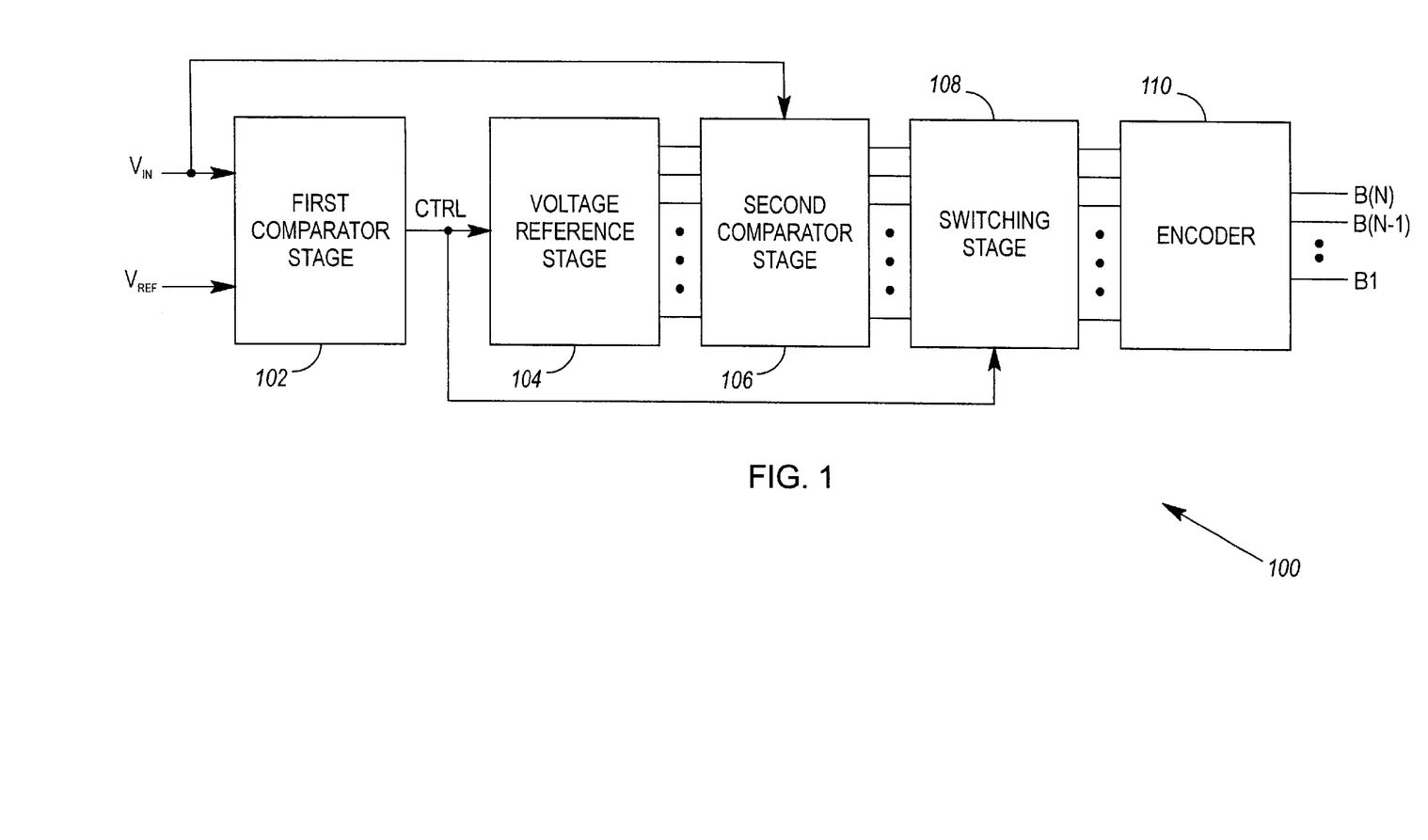
FIG. 1 illustrates an analog-to-digital converter (ADC)

FIG. 1 illustrates an analog-to-digital converter (ADC) 100 comprising first and second comparator stages 102, 106, a voltage reference stage 104, an encoder 110, and a switching stage 108. The first comparator stage 102 receives an analog signal ($V_{IN}$) and a threshold (VREF) and outputs a control signal (CTRL). The voltage reference stage 104 receives the control signal and outputs one of two or more sets of reference voltages. The second comparator stage 106 receives the analog signal ($V_{IN}$) and the set of reference voltages output from the voltage reference stage 104, and in response to comparisons of the analog signal to the reference voltages, outputs a thermometer code. The switching stage 108 receives the control signal (CTRL), and in response thereto, variously couples inputs of the encoder 110 to 1) bits of the thermometer code output from the second comparator stage 106, 2) a first potential, or 3) a second potential. The encoder's output is a digital signal such as a binary digital signal (B3, B2, B1).

Figure 2:
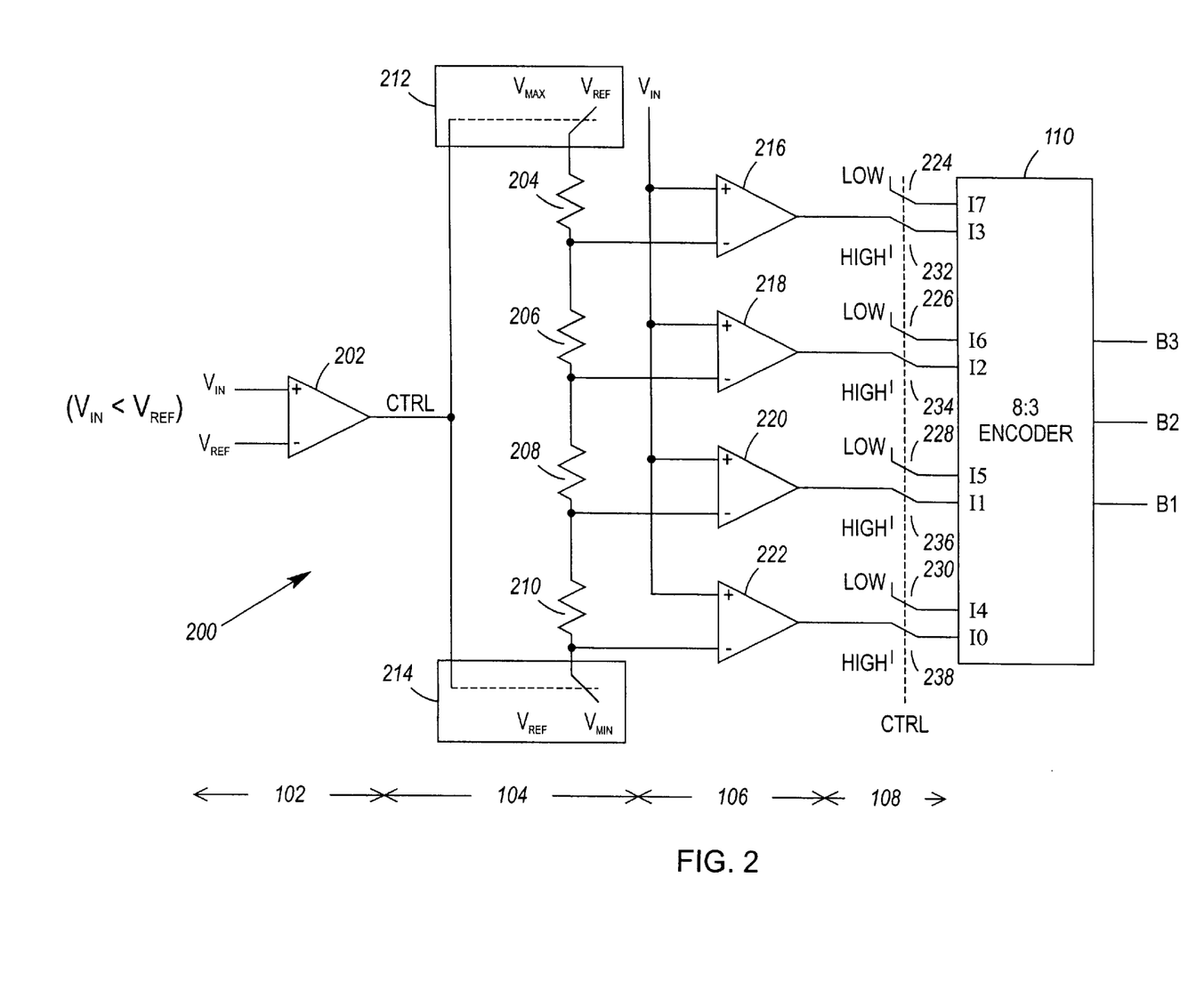
FIG. 2 illustrates an exemplary embodiment of the FIG. 1 ADC, wherein the ADC is configured to operate in a first mode.
Figure 3:
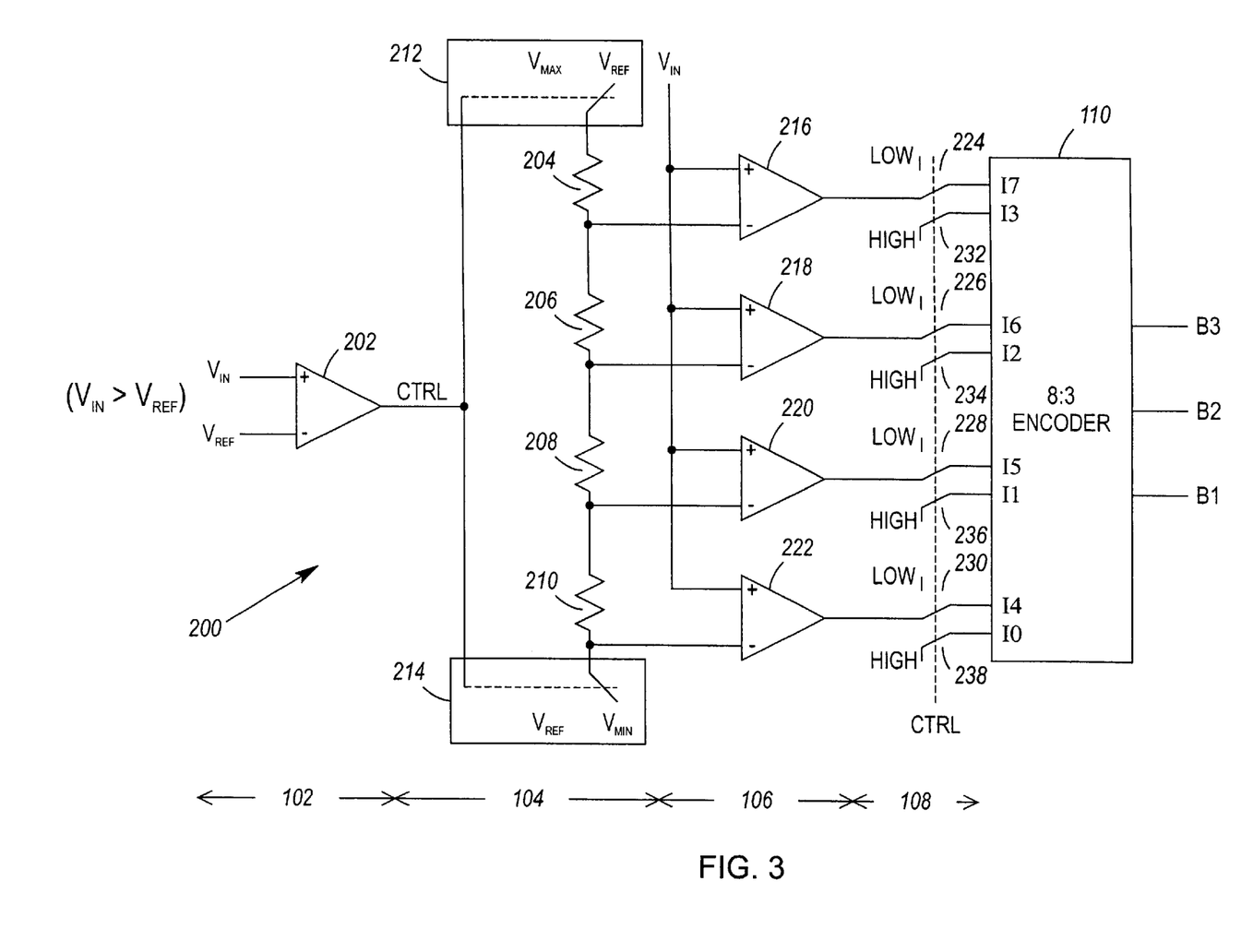
FIG. 3 illustrates the FIG. 2 ADC configured to operate in a second mode.

FIGS. 2 & 3 illustrate an exemplary implementation of the FIG. 1 ADC. In FIGS. 2 & 3, the first comparator stage 102 consists of a single comparator 202. The comparator 202 receives an analog voltage signal ($V_{IN}$) and a voltage threshold (VREF), and in response to a comparison of these two input signals, outputs a control signal (CTRL). In the exemplary embodiment shown, the control signal is driven low when $V_{IN}$<VREF, and HIGH when $V_{IN}$>VREF. The voltage threshold (VREF) is equal to ($V_{MAX}-V_{MIN}$)/2, where $V_{MAX}$ is greater than or equal to a maximum voltage that $V_{IN}$ is expected to assume, and where $V_{MIN}$ is less than or equal to a minimum voltage that $V_{IN}$ is expected to assume. In this manner, the control signal (CTRL) reflects whether the analog voltage signal ($V_{IN}$) is above or below a midpoint of a voltage range extending from $V_{MIN}$ to $V_{MAX}$.

The control signal (CTRL) output from the first comparator stage 102 is provided to a voltage reference stage 104. In response to receiving the control signal, the voltage reference stage 104 outputs one of two sets of reference voltages. The first set of reference voltages ranges from $V_{MIN}$ to VREF (i.e., ($V_{MAX}-V_{MIN}$)/2) and is output when the control signal (CTRL) is low (i.e., when $V_{IN}$<VREF). The second set of reference voltages ranges from VREF to $V_{MAX}$ and is output when the control signal (CTRL) is high (i.e., when $V_{IN}$>VREF).

Each set of reference voltages may be derived from a resistor network. As shown in FIG. 2, the resistor network may comprise a stick of series connected resistors 204, 206, 208, 210, with each reference voltage being output from an end of one of the series connected resistors 204–210. As defined herein, a stick of series connected resistors includes, but is not limited to, both of the following: 1) discrete resistive components connected in series 204–210, and 2) a continuous resistive component from which a plurality of taps are taken.

As shown in FIGS. 2 & 3, ends of the resistor stick 204–210 are alternately coupled to differing voltages by a number of switches 212, 214, with each of the switches being operated by the control signal (CTRL) provided by the first comparator stage 102. A first of the switches 212 is configured to alternately couple a first end of the resistor stick 204–210 to $V_{MAX}$ or VREF, and a second of the switches 214 is configured to alternately couple a second end of the resistor stick 204–210 to VREF or $V_{MIN}$. In this manner, the resistor stick 204–210 may be coupled between $V_{MAX}$ and VREF when the control signal indicates, that $V_{IN}$ is greater than VREF, and the resistor stick 204–210 may be coupled between VREF and $V_{MIN}$ when the control signal indicates that $V_{IN}$ is less than VREF. Thus, depending upon the state of the control signal, one of two sets of reference voltages may be output from the resistor stick 204–210.

The reference voltages output from the voltage reference stage 104 are supplied to a second comparator stage 106. The second comparator stage 106 comprises a plurality of comparators 216, 218, 220, 222 that, taken together, produce a thermometer code output (i.e., an output in which bits are consecutively asserted, beginning with a least significant bit). Each of the comparators 216–222 comprises two inputs, one of which is coupled to the analog voltage signal ($V_{IN}$), and one of which is coupled to a unique output from the voltage reference stage 104. In this manner, each comparator 216–222 receives a different output from the voltage reference stage 104 and compares the analog voltage signal to a different reference voltage. The output of each comparator 216–222 is coupled to two inputs of an encoder 110 via a switching stage 108.

The thermometer code that is output from the second comparator stage 106 is provided to a switching stage 108. The switching stage 108 alternately couples the output of each comparator 216–222 in the second comparator stage 106 to a most significant bit (MSB) input and a least significant bit (LSB) input of an encoder 110. In FIG. 2, the outputs of the second comparator stage 106 are shown coupled to the encoder's LSB inputs (I0–I3). In FIG. 3, the outputs of the second comparator stage 106 are shown coupled to the encoder's MSB inputs (i.e., I4–I7). When an encoder input is not coupled to a comparator 216–222 of the second comparator stage 106, the encoder input is coupled to either a first (LOW) or second (HIGH) potential.

In FIGS. 2 & 3, the switching performed by the switching stage 108 is accomplished by eight switches 224, 226, 228, 230, 232, 234, 236, 238, each of which is operated by the control signal (CTRL) produced by the first comparator stage 102. Half of the switches 224–230 are configured to alternately couple MSB inputs of the encoder 110 to either 1) outputs of the second comparator stage 106, or 2) a LOW potential. The other half of the switches 232–238 are configured to alternately couple LSB inputs of the encoder to either 1) outputs of the second comparator stage 106, or 2) a HIGH potential.

The switching stage 108 shown in FIGS. 2 & 3 operates as follows. When CTRL is pulled low as a result of $V_{IN}$ being less than VREF, the switches 224–230 coupled to the encoder's MSB inputs couple the encoder's MSB inputs to a LOW potential (see FIG. 2). At the same time, the switches 232–238 coupled to the encoder's LSB inputs couple the encoder's LSB inputs to outputs of the second comparator stage 106.

In FIG. 3, CTRL is pulled high as a result of $V_{IN}$ being greater than VREF. When CTRL is pulled high, the switches 224–230 coupled to the encoder's MSB inputs couple the encoder's MSB inputs to outputs of the second comparator stage 106. At the same time, the switches 232–238 coupled to the encoder's LSB inputs couple the encoder's LSB inputs to a HIGH potential.

As will be described in greater detail later in this description, the switches 224–238 of the switching stage 108 may comprise a plurality of pass gates 500, 504 that correspond to the inputs of the encoder 110 (see FIG. 5). Each pass gate 500, 504 may comprise 1) an input that is coupled to an output of one of the plurality of comparators 216–222, and 2) an output that is coupled to an input of the encoder 110. Each pass gate 500, 504 may then be controlled by means of the control signal (CTRL) that is generated by the first comparator stage 102.

The switches 224–238 may also comprise a number of transistors 502, 506. A first number of transistors 506 may be coupled between outputs of the pass gates and a first potential (e.g., LOW), and a second number of transistors 502 may be coupled between outputs of the pass gates and a second potential (e.g., HIGH). All of the transistors 502, 506 may be controlled by means of the control signal (CTRL).

The theory behind the ADC illustrated in FIGS. 2 & 3 is as follows. In a conventional flash ADC 900 (FIG. 9), all of an encoder's MSB inputs are driven LOW until $V_{IN}$ exceeds a predetermined voltage. Once $V_{IN}$ exceeds the predetermined voltage, all of the encoder's LSB inputs are driven HIGH. Although conventional flash ADCs fail to give special meaning to this predetermined voltage, the inventor has recognized its importance and designated it VREF in this description.

As shown in FIG. 9, VREF falls at the midpoint of a conventional flash ADC's resistor stick 902–916. Since the structure of a conventional flash ADC 900 is vertically symmetrical (i.e., constructed with an equal number of resistors and comparators above and below VREF), the $2^N$ resistors 902–916 and comparators 918–932 shown in FIG. 9 may be replaced with the $2^{N-1}$ resistors 204–210 and comparators 216–222 of the voltage reference and second comparator stages 104, 106 illustrated in FIGS. 2 & 3. An additional comparator 202 and plurality of switches 212, 214, 224–238 may then be used to switch the $2^{N-1}$ resistors 204–210 and comparators 216–222 into their FIG. 2 configuration (i.e., when $V_{IN}$<VREF) or their FIG. 3 configuration (i.e., when $V_{IN}$>VREF). In this manner, the total number of comparators needed to construct a flash-type ADC may be reduced from $2^N$ to $2^{N-1}+1$, and the total number of resistors may also be reduced from $2^N$ to $2^{N-1}$.

Just like the ADC 900 illustrated in FIG. 9, the ADC 200 illustrated in FIGS. 2 & 3 is easy to construct. However, the ADC 200 illustrated in FIGS. 2 & 3 also provides many advantages over the ADC illustrated in FIG. 9, such as: 1) approximately half the input capacitance, 2) a lower aspect ratio, 3) reduced power dissipation, 4) a reduction in the impedance mismatch at the inputs to the second comparator stage 106 (as a result of there being fewer stacked comparators 216–222 in the stage), and 5) a lower probability of component mismatch in the second comparator stage 106 (again, as a result of there being fewer comparators 216–222 in the stage).

The ADC 200 illustrated in FIGS. 2 & 3 may be fabricated using a variety of technologies, including, for example, Complimentary Metal-Oxide Semiconductor (CMOS) and bipolar technologies. However, a currently preferred technology is CMOS Silicon-On-Insulator technology, in that it provides a lower-power, higher-speed alternative as compared to bipolar and bulk CMOS technologies.

Figure 4:
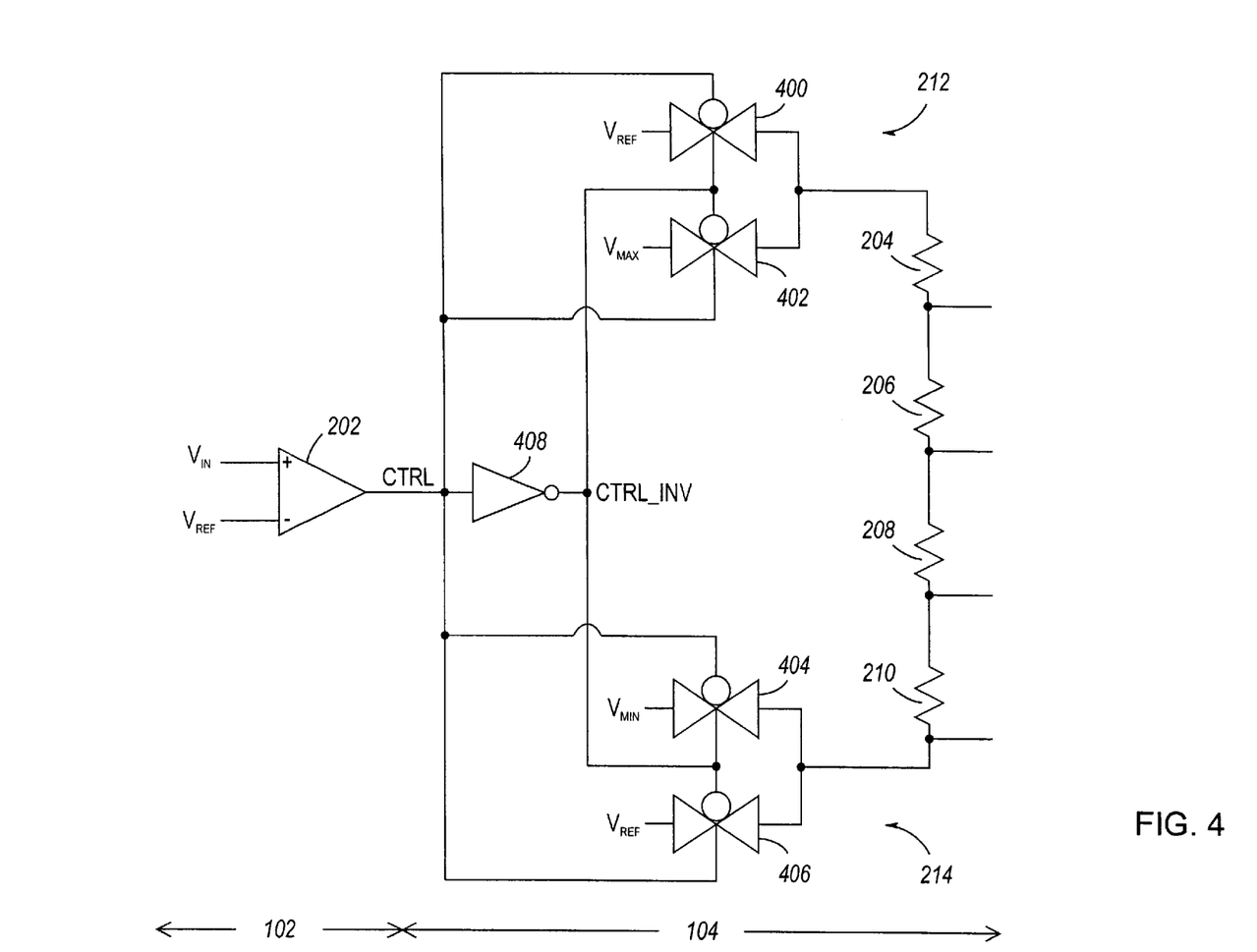
FIG. 4 illustrates an exemplary embodiment of the voltage reference stage switches shown in FIGS. 2 & 3.
Figure 5:
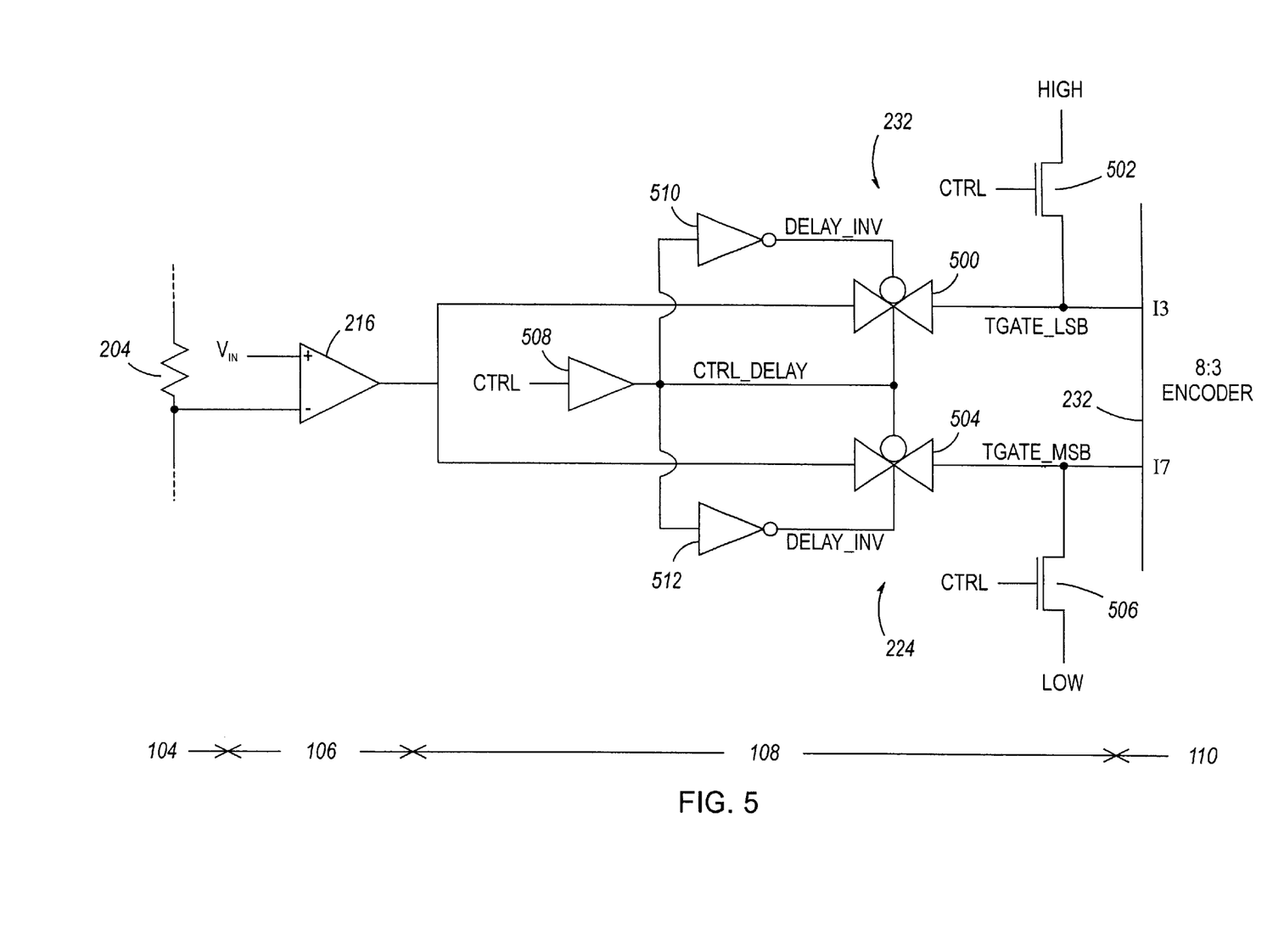
FIG. 5 illustrates an exemplary embodiment of the switching stage switches shown in FIGS. 2 & 3.

FIGS. 4 & 5 illustrate exemplary embodiments of the switching components 212, 214, 224–238 illustrated in FIGS. 2 & 3. FIG. 4 illustrates an exemplary embodiment of the voltage reference stage switches 212, 214. Each switch 212, 214 comprises a pair of pass gates 400/402, 404/406 that have their outputs coupled to one end of the resistor stick 204–210. Each pass gate 400–406 receives the control signals CTRL and CNTRL_INV (with CTRL_INV being supplied by an inverter 408 that receives CTRL at its input).

The pass gates 400, 402 of the upper switch 212 are respectively configured to receive the voltages VREF and $V_{MAX}$ at their inputs. The pass gate 400 that receives VREF is configured to 1) pass VREF to its output when CTRL is pulled low (i.e., when $V_{IN}$<VREF), and 2) pass nothing when CTRL is pulled high (i.e., when $V_{IN}$>VREF). The pass gate 402 that receives $V_{MAX}$ is configured to 1) pass $V_{MAX}$ to its output when CTRL is pulled high, and 2) pass nothing when CTRL is pulled low. In this manner, the upper end of the resistor stick 204–210 is tied to VREF when $V_{IN}$<VREF, and to $V_{MAX}$ when $V_{IN}$>VREF.

The pass gates 404, 406 of the lower switch 214 function similarly to those of the upper switch 212, but with different input voltages being passed. The first pass gate 404 receives $V_{MIN}$ at its input and 1) passes $V_{MIN}$ to its output when CTRL is pulled low (i.e., when $V_{IN}$<VREF), and 2) passes nothing when CTRL is pulled high (i.e., when $V_{IN}$>VREF). The second pass gate 406 receives VREF at its input and 1) passes VREF to its output when CTRL is pulled high, and 2) passes nothing when CTRL is pulled low. In this manner, the lower end of the resistor stick 204–210 is tied to $V_{MIN}$ when $V_{IN}$<VREF, and to $V_{MAX}$ when $V_{IN}$>VREF.

FIG. 5 illustrates an exemplary embodiment of the switching stage switches 224–238 found in FIGS. 2 & 3. Specifically, FIG. 5 illustrates the switches 224, 232 that are coupled to inputs 13 and 17 of the encoder 110 shown in FIGS. 2 & 3.

The switch 232 that is coupled to input 13 of the encoder 110 comprises a pass gate 500 and a pull-up transistor 502, each of which is coupled to input 13 of the encoder 110 via the node TGATE_LSB. The pull-up transistor 502 is coupled via its source and drain between a HIGH potential and the node TGATE_LSB. The gate of the transistor 502 is driven by CTRL so that the node TGATE_LSB is pulled high when $V_{IN}$>VREF. When $V_{IN}$<VREF, the pull-up transistor 502 ceases to conduct so that the node TGATE_LSB may be driven by the pass gate 500. The pass gate 500 is controlled by the signals CTRL_DELAY and DELAY_INV (with CTRL_DELAY being supplied by a buffer 508 that receives CTRL at its input, and with DELAY_INV being supplied by inverters 510, 512 that receive CTRL_DELAY at their inputs). Note that the signals CTRL_DELAY and DELAY_INV are merely delayed versions of the signals CTRL and CTRL_INV. The signals CTRL_DELAY and DELAY_INV are used to control the pass gate 500 so that, in the event that $V_{IN}$>VREF, node TGATE_LSB may be pulled high prior to a drive fight being initiated by the pass gate 500. The input to the pass gate 500 is coupled to the output of a corresponding comparator 216 so that the pass gate 500 passes the output of the comparator 216 to the node TGATE_LSB when $V_{IN}$<VREF.

The switch 224 that is coupled to input 17 of the encoder 110 comprises a pass gate 504 and a pull-down transistor 506, each of which is coupled to input 17 of the encoder 110 via the node TGATE_MSB. The pull-down transistor 506 is coupled via its source and drain between a LOW potential and the node TGATE_MSB. The gate of the transistor 506 is driven by CTRL so that the node TGATE_MSB is pulled low when $V_{IN}$<VREF. When $V_{IN}$>VREF, the pull-down transistor 506 ceases to conduct so that the node TGATE_MSB may be driven by the pass gate 504. The pass gate 504 is controlled by the signals CTRL_DELAY and DELAY_INV. The input to the pass gate 504 is coupled to the output of a corresponding comparator 216 so that the pass gate 504 passes the output of the comparator 216 to the node TGATE_MSB when $V_{IN}$>VREF.

Having completed a description of the analog-to-digital converters 100, 200 and components thereof illustrated in FIGS. 1–5, a number of methods 600, 700 for making analog-to-digital conversions will now be described.

Figure 6:
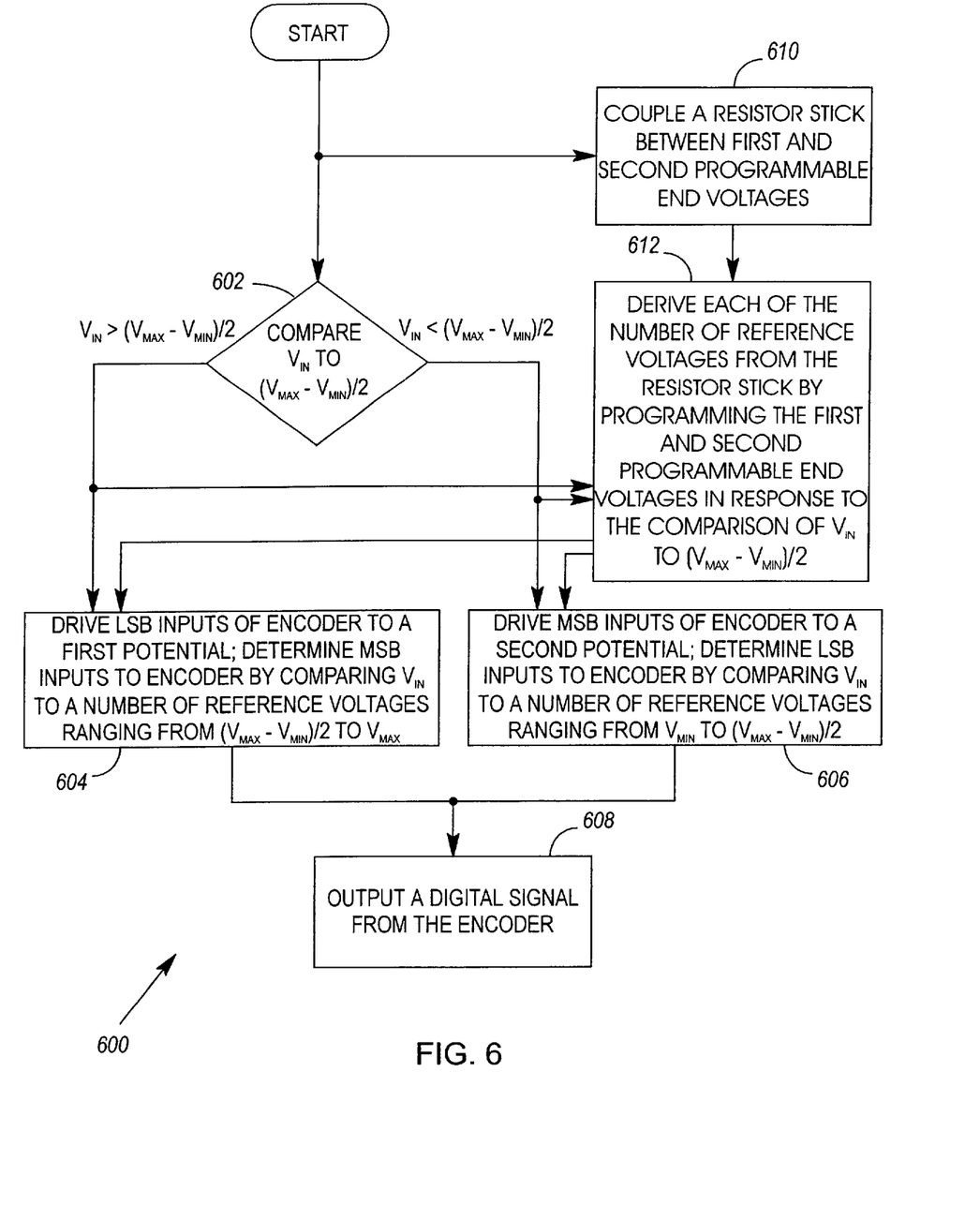
FIG. 6 illustrates a first exemplary method for converting analog signals to digital signals.

FIG. 6 illustrates a first exemplary method 600 for converting analog signals to digital signals. The method 600 commences with the comparison 602 of an analog signal, $V_{IN}$, to $(V_{MAX}-V_{MIN})/2$, where $V_{MAX}$ and $V_{MIN}$ define an expected voltage range for $V_{IN}$. In response to $V_{IN}$ being greater than $(V_{MAX}-V_{MIN})/2$, the LSB inputs of an encoder are driven 604 to a first potential, and the MSB inputs of the encoder are determined 604 by comparing $V_{IN}$ to a number of reference voltages ranging from $(V_{MAX}-V_{MIN})/2$ to $V_{MAX}$. In response to $V_{IN}$ being less than $(V_{MAX}-V_{MIN})/2$, the MSB inputs of the encoder are driven 606 to a second potential, and the LSB inputs of the encoder are determined 606 by comparing $V_{IN}$ to a number of reference voltages ranging from $V_{MIN}$ to $(V_{MAX}-V_{MIN})/2$. In either case, a digital signal is then output 608 from the encoder.

As is demonstrated in FIG. 5, the MSB and LSB inputs of an encoder 110 may be driven to first and second potentials by means of pull-up and pull-down transistors 502, 506 that are coupled to the encoder's MSB and LSB inputs. The pull-up and pull-down transistors 502, 506 may then be controlled by means of a control signal (CTRL), wherein the state of the control signal is determined by the comparison of $V_{IN}$ to $(V_{MAX}-V_{MIN})/2$.

Although not required, the method 600 illustrated in FIG. 6 may comprise isolating an encoder's LSB and MSB inputs from logic 216–222 (FIG. 2) that determines their respective states. Thus, when the LSB inputs of an encoder 110 are driven to a first potential, the encoder's LSB inputs may be isolated from logic 216–222 that determines their state when $V_{IN}$ is less than $(V_{MAX}-V_{MIN})/2$. Likewise, when the MSB inputs of an encoder 110 are driven to a second potential, the encoder's MSB inputs may be isolated from logic 216–222 that determines their state when $V_{IN}$ is greater than $(V_{MAX}-V_{MIN})/2$.

The reference voltages referred to in the FIG. 6 method may be derived in a number of ways. An exemplary way, however, involves coupling 610 a resistor stick 204–210 between first and second programmable end voltages. Each of the number of reference voltages are then derived from the resistor stick 204–210 by programming 612 the first and second programmable end voltages in response to the comparison of $V_{IN}$ to $(V_{MAX}-V_{MIN})/2$.

Figure 7:
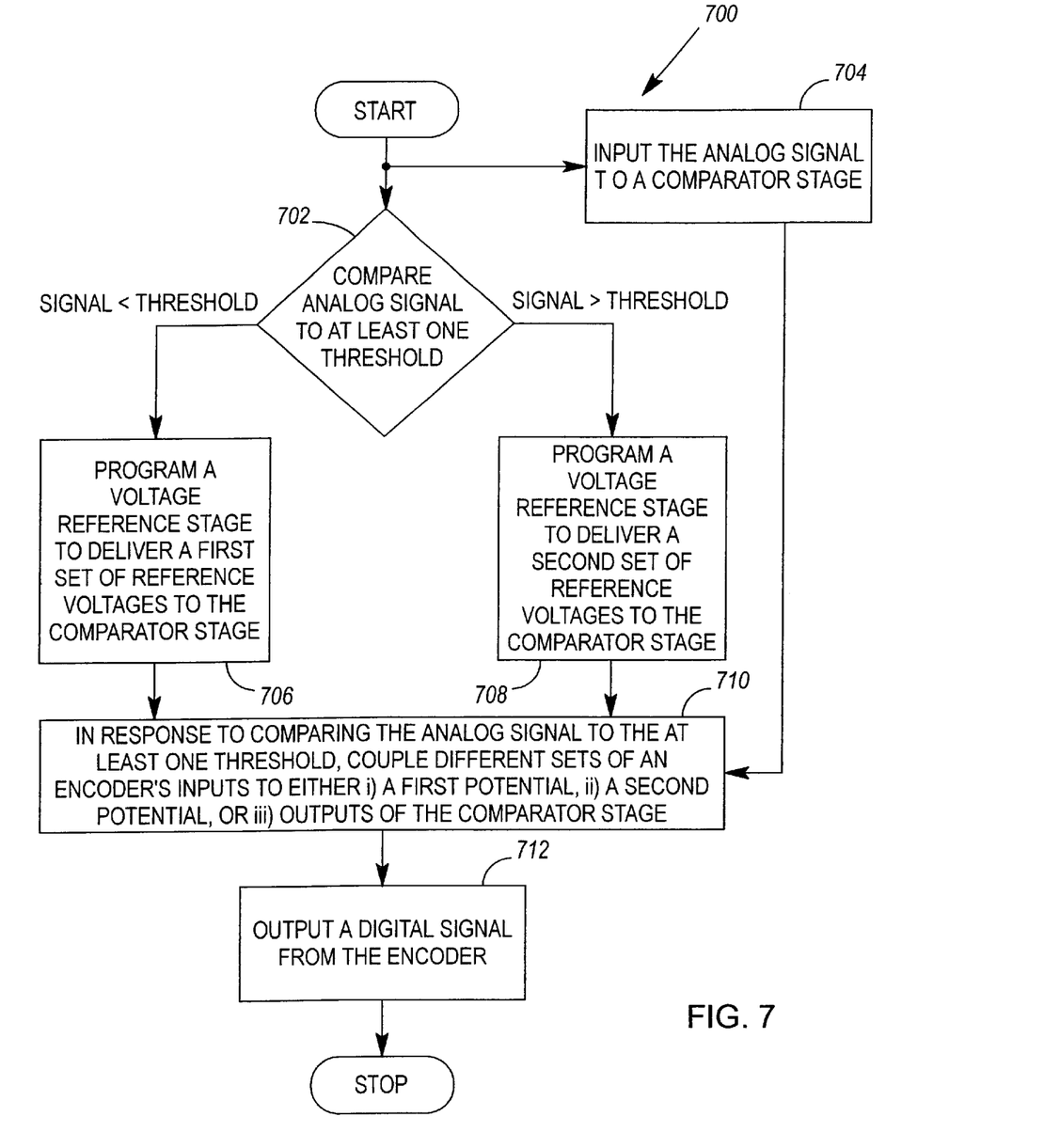
FIG. 7 illustrates a second exemplary method for converting analog signals to digital signals.

FIG. 7 illustrates a second exemplary method 700 for converting analog signals to digital signals. The method 700 commences with the comparison 702 of an analog signal to at least one threshold, as well as the input 704 of the analog signal to a comparator stage. In response to comparing the analog signal to the at least one threshold, a voltage reference stage is programmed 706, 708 to deliver one of two or more sets of reference voltages to the comparator stage. Also in response to comparing the analog signal to the at least one threshold, different sets of an encoder's inputs are then coupled 710 to either a first potential, a second potential, or outputs of the comparator stage. Finally, a digital signal is output 712 from the encoder.

The voltage reference stage may be programmed to deliver one of two or more sets of reference voltages to the comparator stage by 1) switching first and second voltages applied to ends of a resistor stick, in response to the afore-mentioned comparison of an analog signal to at least one threshold, and then 2) utilizing different taps from the resistor stick to deliver a set of reference voltages to the comparator stage.

Each comparison of the analog signal to a threshold may be used to generate a control signal, wherein the control signal is indicative of the result of the comparison. If one or more such control signals are generated, an encoder's inputs may be coupled to first and second potentials by means of pull-up and pull-down transistors, with each transistor being controlled by one or more of the afore-mentioned control signal(s). The encoder's inputs may be coupled to outputs of a comparator stage by means of pass gates that are also controlled by the afore-mentioned control signal(s).

In one embodiment of the FIG. 7 method 700, the at least one threshold is only one threshold, and the two or more sets of reference voltages are only two sets of reference voltages. In this embodiment, the first set of reference voltages may range, for example, from $V_{MIN}$ to $(V_{MAX}-V_{MIN})/2$, and the second set of reference voltages may range, for example, from $(V_{MAX}-V_{MIN})/2$ to $V_{MAX}$. Comparing the analog signal to the at least one threshold then comprises comparing a voltage level of the analog signal to $(V_{MAX}-V_{MIN})/2$.

In another embodiment of the FIG. 7 method, an analog signal is compared to a plurality of thresholds. For example, refer to the ADC 800 illustrated in FIG. 8. The ADC 800 comprises a first comparator stage 802 in which an analog signal, $V_{IN}$, is compared to three different thresholds (REF__A, REF__B, and REF__C). Results of the various comparisons (CTRL__A, CTRL__B, CTRL__C) are used to program a voltage reference stage 804 to deliver one of two different sets of reference voltages to a second comparator stage 806. The second comparator stage 806 compares each of the reference voltages to the analog signal, $V_{IN}$. Then, in response to various control signals generated as a result of $V_{IN}$ being compared to REF__A, REF__B, and REF__C, an encoder's inputs are coupled to either a first potential, a second potential, or outputs of the second comparator stage 808. The encoder 810 then outputs a digital signal (B3, B2, B1).

Figure 8:
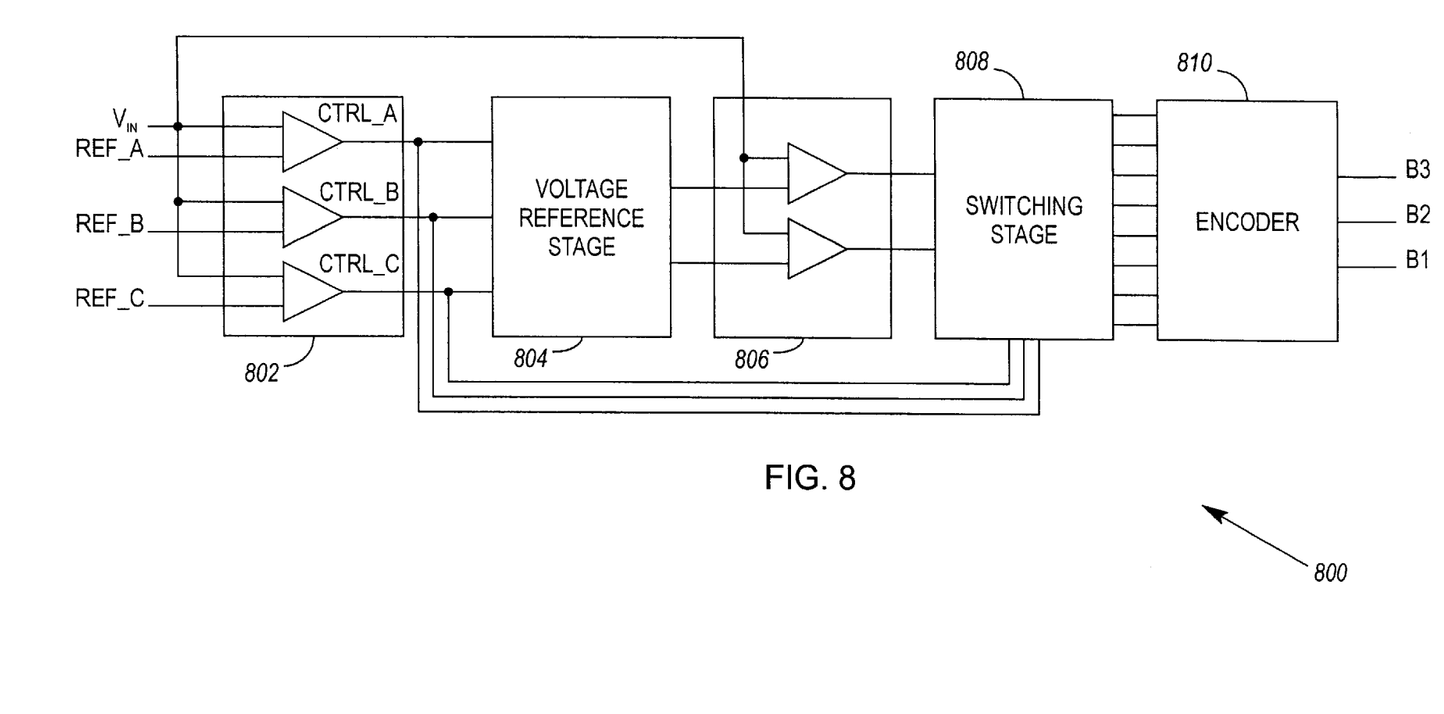
FIG. 8 illustrates an ADC that operates in conformance with the method shown in FIG. 7.

Although the ADC 800 shown in FIG. 8 may provide few advantages over the ADC 200 shown in FIG. 2, the teachings illustrated in FIG. 8 might provide significant advantages for larger values of N (where N is the number of bits output from the ADC 800). For example, consider an 8-bit ADC that receives only a single reference voltage. In a scenario such as that which is illustrated in FIG. 2, an 8-bit ADC would require one comparator in its first comparator stage and 128 comparators in its second comparator stage. This represents a total comparator count of 129. On the other hand, configuring an 8-bit ADC as shown in FIG. 8 would raise the number of comparators in the first stage to three, but lower the number of comparators in the second stage to sixty-four. The comparator count is thus reduced to sixty-seven (for a savings of nearly fifty percent).

The FIG. 8 ADC 800 is advantageous in that it can reduce an ADC's overall component count, as well as improve the aspect ratio of an ADC (for better die usage). However, a disadvantage of the FIG. 8 ADC 800 is that it can lead to increased switching delay as an input signal is analyzed in the ADC's first comparator stage 802.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. An analog-to-digital converter, comprising:
   a) a first comparator stage receiving an analog signal and a threshold and outputting a control signal;
   b) a voltage reference stage receiving said control signal and outputting one of two or more sets of reference voltages;
   c) a second comparator stage receiving said analog signal and said one of two or more sets of reference voltages, said second comparator stage outputting a thermometer code in response to comparisons of said analog signal to said reference voltages;

d) an encoder; and e) a switching stage receiving said control signal, and in response thereto, variously coupling inputs of said encoder to: bits of the thermometer code output from the second comparator stage, a first potential, or a second potential.

2. An analog-to-digital converter as in claim 1, wherein:

a) said two or more sets of reference voltages are comprised of two sets, a first of which ranges from $V_{MIN}$ to $(V_{MAX}-V_{MIN})/2$, and a second of which ranges from $(V_{MAX}-V_{MIN})/2$ to $V_{MAX}$; and b) said at least one threshold comprises the threshold $(V_{MAX}-V_{MIN})/2$.

3. An analog-to-digital converter as in claim 1, wherein the voltage reference stage comprises:

a) a stick of series connected resistors, wherein each of said reference voltages is output from an end of one of the series connected resistors; and b) a pair of switches controlled by said control signal, wherein said pair of switches alternately couple ends of said stick to differing voltages.

4. An analog-to-digital converter as in claim 1, wherein the second comparator stage comprises a plurality of comparators producing said thermometer code, and wherein each comparator comprises:

a) an input coupled to said voltage reference stage;

b) an input coupled to said analog signal; and c) an output coupled to two inputs of said encoder via said switching stage.

5. An analog-to-digital converter as in claim 4, wherein the output of each comparator in the second comparator stage is alternately coupled, via said switching stage, to an MSB input and an LSB input of said encoder.

6. An analog-to-digital converter as in claim 4, wherein the switching stage comprises a plurality of pass gates corresponding to the inputs of said encoder, wherein each pass gate is controlled by said control signal, and wherein each pass gate comprises:

a) an input coupled to an output of one of said plurality of comparators; and b) an output coupled to an input of said encoder.

7. An analog-to-digital converter as in claim 6, wherein, for each of said plurality of comparators, one of said pass gates couples the comparator's output to an MSB input of said encoder, and another of said pass gates couples the comparator's output to an LSB input of said encoder.

8. An analog-to-digital converter as in claim 1, wherein the switching stage comprises a plurality of pass gates corresponding to the inputs of said encoder, wherein each pass gate is controlled by said control signal, and wherein each pass gate comprises:

a) an input coupled to an output of said comparator stage; and b) an output coupled to an input of said encoder.

9. An analog-to-digital converter as in claim 8, wherein the switching stage further comprises:

a) a first number of transistors coupled between a first number of outputs of said pass gates and said first potential; and b) a second number of transistors coupled between a second number of outputs of said pass gates and said second potential, wherein the first and second numbers of transistors are controlled by said control signal.

10. An analog-to-digital converter as in claim 1, wherein the analog-to-digital converter is implemented in CMOS technology.

11. An analog-to-digital converter as in claim 1, wherein the analog-to-digital converter is implemented in CMOS Silicon-On-Insulator technology.

12. A method for converting analog signals to digital signals, comprising:

a) comparing an analog signal, $V_{IN}$, to $(V_{MAX}-V_{MIN})/2$, where $V_{MAX}$ and $V_{MIN}$ define an expected voltage range for $V_{IN}$;

b) in response to said comparison, generating either a first number of reference voltages ranging from $(V_{MAX}-V_{MIN})/2$ to $V_{MAX}$, or a second number of reference voltages ranging from $V_{MIN}$ to $(V_{MAX}-V_{MIN})/2$;

c) in response to $V_{IN}$ being greater than $(V_{MAX}-V_{MIN})/2$:
i) driving LSB inputs of an encoder to a first potential; and
ii) determining MSB inputs to the encoder by comparing $V_{IN}$ to a the first number of reference voltages;

d) in response to $V_{IN}$ being less than $(V_{MAX}-V_{MIN})/2$:
i) driving the MSB inputs of the encoder to a second potential; and
ii) determining the LSB inputs to the encoder by comparing $V_{IN}$ to a the second number of reference voltages; and e) outputting a digital signal from the encoder.

13. A method as in claim 12, further comprising:

a) driving the MSB and LSB inputs of the encoder to the first and second potentials by means of pull-up and pull-down transistors that are coupled to the MSB and LSB inputs; and b) controlling the pull-up and pull-down transistors by means of a control signal, wherein the state of the control signal is determined by the comparison of $V_{IN}$ to $(V_{MAX}-V_{MIN})/2$.

14. A method as in claim 12, further comprising:

a) when the LSB inputs of the encoder are driven to the first potential, isolating the LSB inputs from logic that determines the state of the LSB inputs when $V_{IN}$ is less than $(V_{MAX}-V_{MIN})/2$; and b) when the MSB inputs are driven to the second potential, isolating the MSB inputs from logic that determines the state of the MSB inputs when $V_{IN}$ is greater than $(V_{MAX}-V_{MIN})/2$.

15. A method as in claim 12, further comprising:

a) coupling a resistor stick between first and second programmable end voltages; and b) deriving each of the number of reference voltages from the resistor stick by programming the first and second end voltages in response to the comparison of $V_{IN}$ to $(V_{MAX}-V_{MIN})/2$.

16. A method for converting analog signals to digital signals, comprising:

a) inputting an analog signal to a comparator stage;

b) comparing the analog signal to at least one threshold, and in response thereto:
i) programming a voltage reference stage to deliver one of two or more sets of reference voltages to the comparator stage; and
ii) coupling different sets of an encoder's inputs to either:
A) a first potential;
B) a second potential; or
C) outputs of the comparator stage; and c) outputting a digital signal from the encoder.

17. A method as in claim 16, wherein the at least one threshold is only one threshold, and wherein the two or more sets of reference voltages are only two sets of reference voltages.

18. A method as in claim 16, wherein:
a) the two or more sets of reference voltages comprises two sets, a first of which ranges from $V_{MIN}$ to $(V_{MAX}-V_{MIN})/2$, and a second of which ranges from $(V_{MAX}-V_{MIN})/2$ to $V_{MAX}$; and
b) comparing the analog signal to the at least one threshold comprises comparing a voltage level of the analog signal to $(V_{MAX}-V_{MIN})/2$.

19. A method as in claim 16, wherein programming the voltage reference stage to deliver one of two or more sets of reference voltages comprises:
a) in response to comparing the analog signal to the at least one threshold, switching first and second voltages that are applied to ends of a resistor stick;
b) utilizing different taps from the resistor stick to deliver a set of reference voltages to the comparator stage.

20. A method as in claim 16, wherein comparing the analog signal to the at least one threshold produces a control signal, the method further comprising:
a) coupling encoder inputs to the first and second potentials by means of pull-up and pull-down transistors controlled by the control signal; and
b) coupling encoder inputs to outputs of the comparator stage by means of pass gates controlled by the control signal.

* * * * *